United States Patent
Sekine et al.

(10) Patent No.: US 11,374,533 B2
(45) Date of Patent: Jun. 28, 2022

(54) SOLAR POWER GENERATION PADDLE, METHOD OF MANUFACTURING THE SAME, AND SPACE STRUCTURE

(71) Applicant: Mitsubishi Electric Corporation, Tokyo (JP)

(72) Inventors: Kazushi Sekine, Tokyo (JP); Masahiro Miyashita, Tokyo (JP); Kazunori Takagaki, Tokyo (JP); Naoko Koyama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/044,342

(22) PCT Filed: Nov. 16, 2018

(86) PCT No.: PCT/JP2018/042530
§ 371 (c)(1),
(2) Date: Oct. 1, 2020

(87) PCT Pub. No.: WO2019/230019
PCT Pub. Date: Dec. 5, 2019

(65) Prior Publication Data
US 2021/0028745 A1    Jan. 28, 2021

(30) Foreign Application Priority Data
May 31, 2018 (JP) .............................. JP2018-104364

(51) Int. Cl.
*H02S 40/44* (2014.01)
*H02S 40/34* (2014.01)
(Continued)

(52) U.S. Cl.
CPC .............. *H02S 40/44* (2014.12); *B64G 1/443* (2013.01); *B64G 1/446* (2013.01);
(Continued)

(58) Field of Classification Search
CPC .................................. B64G 1/443; B64G 1/44
See application file for complete search history.

(56) References Cited

U.S. PATENT DOCUMENTS 6,005,184 A * 12/1999 Barnes .................. H01L 31/048
136/244
6,347,521 B1   2/2002 Kadotani et al.
(Continued)

FOREIGN PATENT DOCUMENTS

JP   04-146897 A   5/1992
JP   2003-174203 A   6/2003
(Continued)

OTHER PUBLICATIONS

Hexcel, "Prepreg Technology", published by Hexcel in 2013, All Pages. (Year: 2013).*
(Continued)

*Primary Examiner* — Daniel P Malley, Jr.
(74) *Attorney, Agent, or Firm* — Xsensus LLP

(57) ABSTRACT

A solar power generation paddle includes a blanket that is stored by being taken up into a roll with using extension masts, and that is extended. Solar battery cells are disposed on one surface of the blanket, and thermoelectric conversion elements are disposed on the other surface of the blanket. A plurality of heat dissipation members are disposed on surfaces of the thermoelectric conversion elements which are opposite to surfaces near the blanket, along an extending direction, to cover the thermoelectric conversion elements.

16 Claims, 12 Drawing Sheets

(51) Int. Cl.
*B64G 1/44* (2006.01)
*H01L 31/0525* (2014.01)
*H01L 35/04* (2006.01)

(52) U.S. Cl.
CPC .......... *H01L 31/0525* (2013.01); *H01L 35/04* (2013.01); *H02S 40/34* (2014.12)

(56) References Cited

U.S. PATENT DOCUMENTS

| | | | |
|---|---|---|---|
| 6,410,971 | B1 | 6/2002 | Otey |
| 9,611,056 | B1* | 4/2017 | Spence ................. B64G 1/222 |
| 2001/0000577 | A1 | 5/2001 | Parise |
| 2003/0038610 | A1 | 2/2003 | Munshi et al. |
| 2011/0209744 | A1 | 9/2011 | Hu |
| 2012/0192920 | A1 | 8/2012 | McCowan et al. |
| 2014/0041705 | A1 | 2/2014 | Kang et al. |
| 2014/0116497 | A1 | 5/2014 | Sanders |
| 2015/0144740 | A1 | 5/2015 | Turse et al. |
| 2015/0280099 | A1 | 10/2015 | Boukai et al. |
| 2016/0035957 | A1 | 2/2016 | Casey |
| 2016/0197259 | A1 | 7/2016 | Boukai et al. |
| 2017/0244018 | A1* | 8/2017 | Miyashita ............... H02N 11/00 |
| 2018/0240957 | A1 | 8/2018 | Boukai et al. |
| 2020/0185957 | A1* | 6/2020 | Pearson ................. B64G 1/425 |

FOREIGN PATENT DOCUMENTS

| | | |
|---|---|---|
| JP | 2007-123911 A | 5/2007 |
| JP | 2009-147208 A | 7/2009 |
| JP | 2011-193013 A | 9/2011 |
| JP | 2012-508466 A | 4/2012 |
| JP | 2012-136053 A | 7/2012 |
| JP | 2014-138135 A | 7/2014 |
| JP | 2016-520993 A | 7/2016 |
| JP | 2017-510992 A | 4/2017 |
| WO | 2005/117154 A1 | 12/2005 |
| WO | 2016/031667 A1 | 3/2016 |
| WO | WO-2016031667 A1 * | 3/2016 ............... B32B 3/12 |

OTHER PUBLICATIONS

English machine translation of Kobayashi et al. (WO-2016031667-A1) provided by the EPO website. 2021. All Pages. (Year: 2021).*

International Search Report and Written Opinion dated Feb. 5, 2019 for PCT/JP2018/042530 filed on Nov. 16, 2018, 8 pages including English Translation of the International Search Report.

Hoang B.; et al., "Commercialization of Deployable Space Systems Roll Out Solar Array (ROSA) technology for Space Systems Loral (SSL) solar arrays", 2016 IEEE Aerospace Conference, Big Sky, MT, Jun. 30, 2016, pp. 1-12.

Extended European search report dated Jun. 14, 2021, in corresponding European patent Application No. 18920615.4, 10 pages.

Jung Hyun et al., "Printed Thermoelectric Generator for Hybrid Tandem Photovoltaic/Thermoelectric Device", Recent Progress in Space Technology, 2013, vol. 3, No. 2, pp. 132-151, USA.

Richard M. Kurland et al., "Advanced Photovoltaic Solar Array Program Status", Proceedings of the 24th Intersociety Energy Conversion Engineering Conference, vol. 2, IFFF, Aug. 6-11, 1989, pp. 829-834, USA.

* cited by examiner

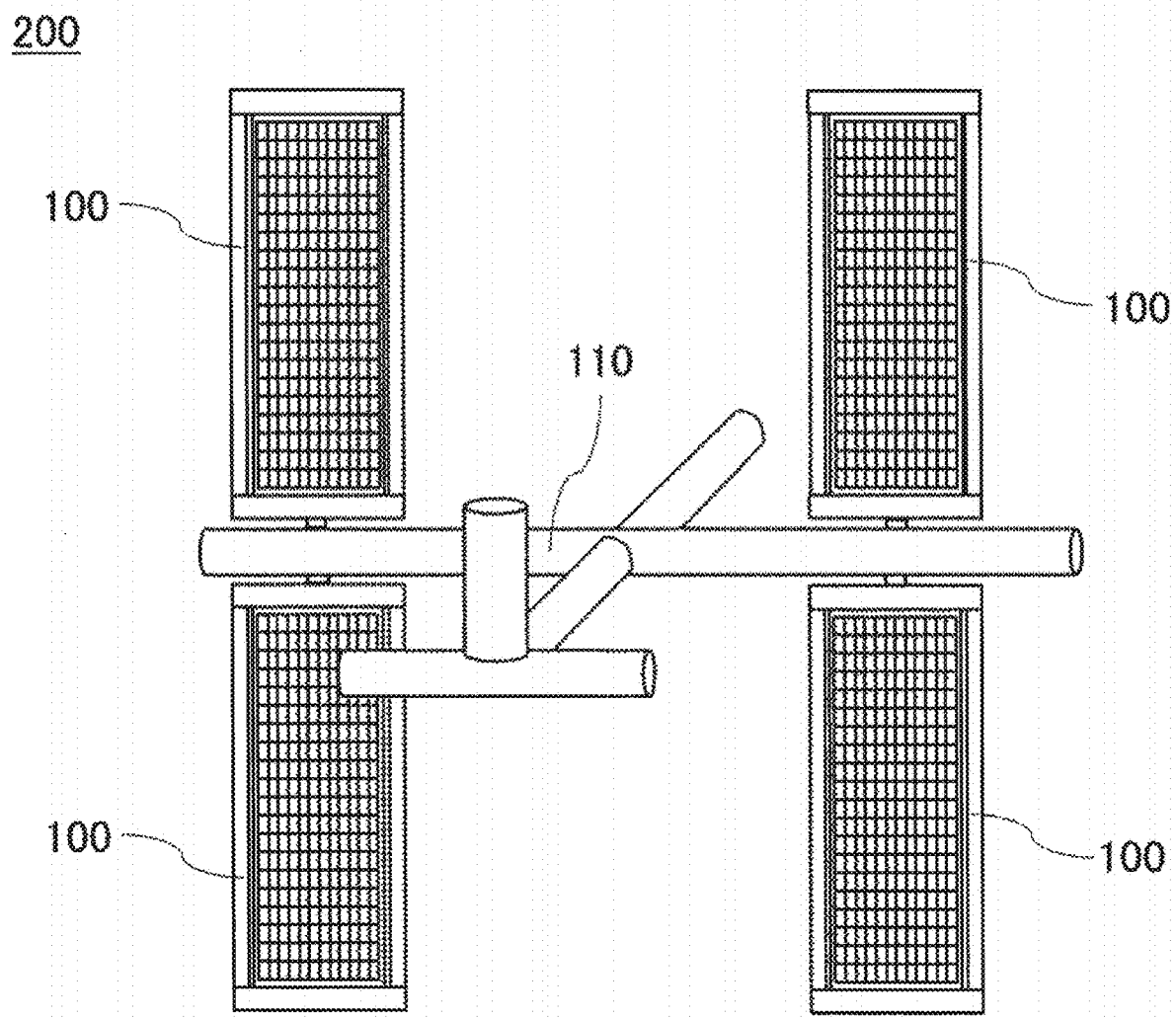

SOLAR POWER GENERATION PADDLE, METHOD OF MANUFACTURING THE SAME, AND SPACE STRUCTURE

CROSS-REFERENCE TO RELATED APPLICATIONS

The present application is based on PCT filing PCT/JP2018/042530, filed Nov. 16, 2018, which claims priority to JP 2018-104364, filed May 31, 2018, the entire contents of each are incorporated herein by reference.

TECHNICAL FIELD

The present invention relates to a solar power generation paddle, a method of manufacturing the same, and a space structure provided with a solar power generation paddle.

BACKGROUND ART

In recent years, demand has increased for high-speed, large-capacity communication utilizing an artificial satellite, and development of a communication broadcasting satellite mounted with an intelligent communication device is in progress. In such an artificial satellite, as the power consumption of the communication device increases, a solar power generation paddle capable of supplying a large amount of power is sought for. A solar battery cell is mounted on the solar power generation paddle, and converts sunlight into electrical energy, so that power is obtained. Normally, at the time of launching, the solar power generation paddle is stored in a folded state in a fairing, being a tip portion of a rocket, and is extended into a desired shape in the space.

At present, an artificial satellite generally uses a rigid-type solar power generation paddle in which a solar battery cells are disposed on a plurality of connected flat panels. However, there is a limit to a capacity of the fairing to store the artificial satellite. Thus, in the rigid-type solar power generation paddle, the size and number of panels are restricted.

In view of this, as a means that realizes both a reduction in size and weight of an artificial satellite and an increase in power consumption of the artificial satellite, a flexible-type solar power generation paddle is getting attention in which solar battery cells are disposed on a bendable film-shaped substrate called a blanket, instead of on a flat panel. Non-Patent Literature 1 discloses a technique of taking up into a roll a blanket to which solar battery cells are adhered, and extending the rolled blanket using an extension mast.

Further, as another means that realizes an increase in power of the artificial satellite, an artificial satellite has been developed in which thermoelectric conversion elements for converting heat energy into electric energy are disposed. A thermoelectric conversion element generates power by utilizing a temperature difference between an element front surface and an element rear surface. Patent Literature 1 discloses a technique of embedding, in a structure composed of a honeycomb core and a skin material, a thermoelectric conversion module in the skin material, and placing the structure to come into contact with a mounted device, so that power is generated while separation of thermoelectric conversion elements is prevented.

CITATION LIST

Patent Literature

Patent Literature 1: WIPO International Publication No. 2016/031667 A1

Non-Patent Literature

Non-Patent Literature 1: Bao Hoang; Steve White; Brian Spence; Steven Kiefer, "Commercialization of Deployable Space Systems' roll-out solar array (ROSA) technology for Space Systems Loral (SSL) solar arrays" Aerospace Conference, 30 Jun. 2016

SUMMARY OF INVENTION

Technical Problem

However, in a flexible-type solar power generation paddle, when a new configuration is considered in which thermoelectric conversion elements are disposed on a blanket, a problem arises that it is difficult to prevent dropping of and damage to the thermoelectric conversion elements, which may occur when taking up the blanket into a roll, while increasing the temperature difference between element front surfaces and element rear surfaces of the thermoelectric conversion elements as much as possible.

The present invention has been made to solve the above-mentioned problem, and has as its objective to provide: a solar power generation paddle in which dropping of and damage to the thermoelectric conversion elements, which may occur when taking up the blanket into a roll, are prevented, while the temperature difference between element front surfaces and element back surfaces of the thermoelectric conversion elements is increased as much as possible; a method of manufacturing the same; and a space structure.

Solution to Problem

A solar power generation paddle according to the present invention includes:
a blanket; an extension mast having a function of storing, by taking up, the blanket into a roll, and a function of extending the blanket;
a plurality of solar battery cells disposed on one surface of the blanket;
a plurality of thermoelectric conversion elements disposed on the other surface of the blanket; and
a plurality of heat dissipation members disposed on surfaces of the thermoelectric conversion elements which are opposite to surfaces near the blanket, along an extending direction of the extension mast.

A method according to the present invention, of manufacturing a solar power generation paddle includes:
a step of forming an extension mast by laminating a plurality of prepregs, winding the prepregs around a shaft member and covering the prepregs with a bagging film, and pressurizing and heating the prepregs from outside the bagging film;
a step of disposing a plurality of solar battery cells on one surface of a blanket;
a step of disposing a plurality of thermoelectric conversion elements on the other surface of the blanket; and
a step of disposing a plurality of heat dissipation members on surfaces of the thermoelectric conversion elements which are opposite to surfaces near the blanket, along an extending direction of the extension mast.

A space structure according to the preset invention includes:
 a solar power generation paddle; and
 a structure body to which the solar power generation paddle is attached.

Advantageous Effects of Invention

With a solar power generation paddle according to the present invention, a plurality of heat dissipation members are disposed on surfaces of thermoelectric conversion elements which are opposite to surfaces near a blanket, along an extending direction of an extension mast. Thus, it is possible to prevent dropping of and damage to the thermoelectric conversion element while increasing a temperature difference between element front surfaces and element back surfaces of the thermoelectric conversion elements as much as possible, thereby increasing power to be obtained.

Also, with a method of manufacturing a solar power generation paddle according to the present invention, a solar power generation paddle can be obtained by simple processing of forming an extension mast using a prepreg, disposing solar battery cells on one surface of a blanket and thermoelectric conversion elements on the other surface of the blanket, and disposing a plurality of heat dissipating members on surfaces of thermoelectric conversion elements which are opposite to surfaces near the blanket, along an extending direction.

Also, a space structure according to the present invention is provided with a solar power generation paddle in which a blanket is stored by being taken up into a roll by an extension mast, and is extended, and in which a plurality of heat dissipation members are disposed on surfaces of thermoelectric conversion elements which are opposite to surfaces near the blanket, along an extending direction of the extension mast. Thus, while dropping of and damage to the thermoelectric conversion element, which may occur when the blanket is taken up into the roll, are prevented, at the time of launching, the solar power generation paddle can be easily stored in a fairing of a rocket.

BRIEF DESCRIPTION OF DRAWINGS

FIG. 24 is a schematic configuration diagram illustrating another example of the space structure provided with the solar power generation paddles according to Embodiment 5 of the present invention.

DESCRIPTION OF EMBODIMENTS

Embodiment 1

Figure 1:
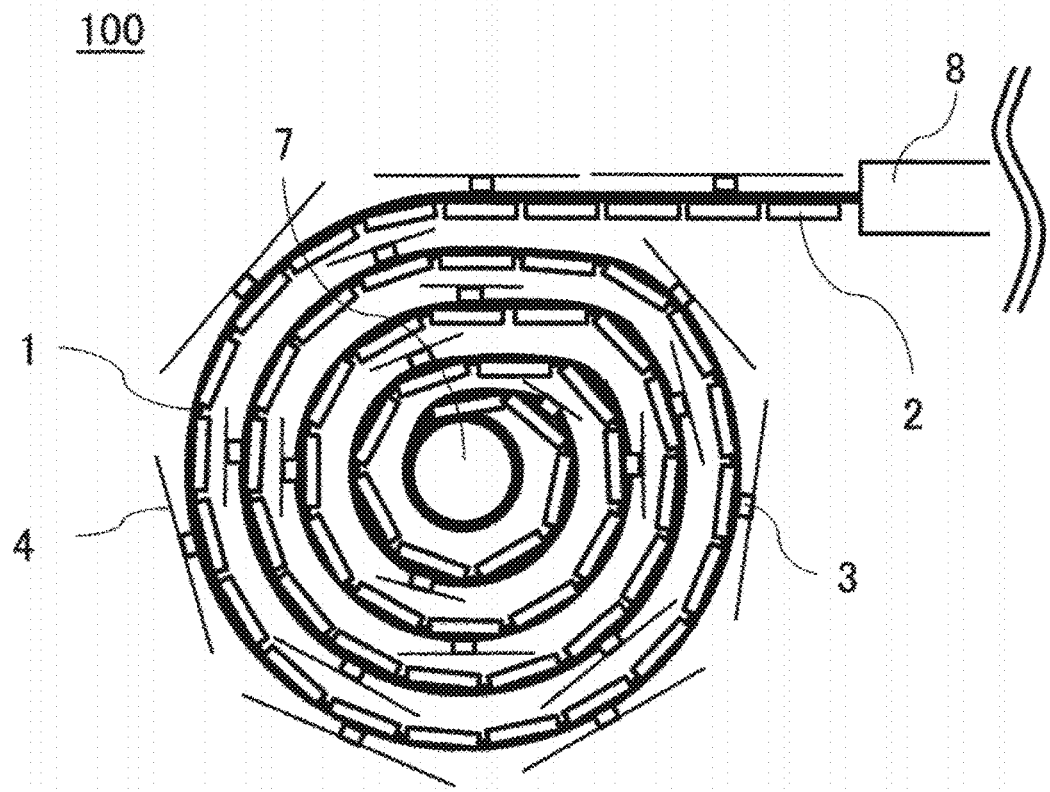
FIG. 1 is a side view illustrating a schematic configuration of a solar power generation paddle according to Embodiment 1 of the present invention.
Figure 2:
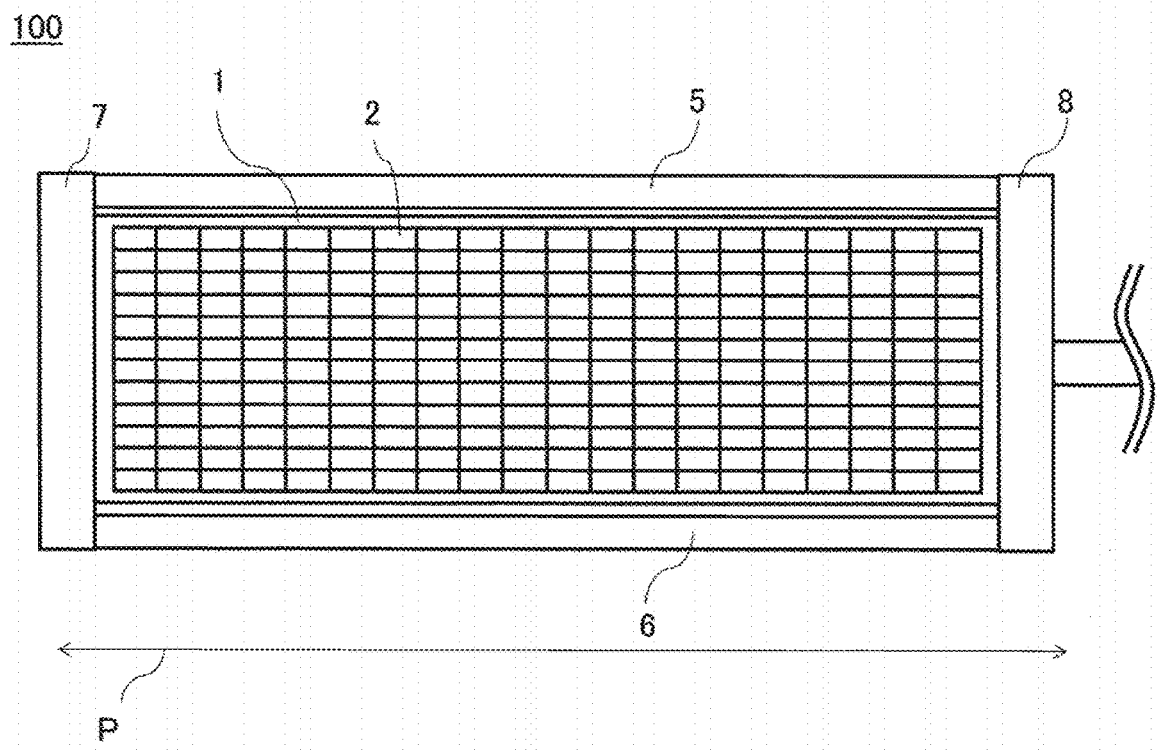
FIG. 2 is a plan view illustrating a schematic configuration of the solar power generation paddle according to Embodiment 1 of the present invention.
Figure 3:
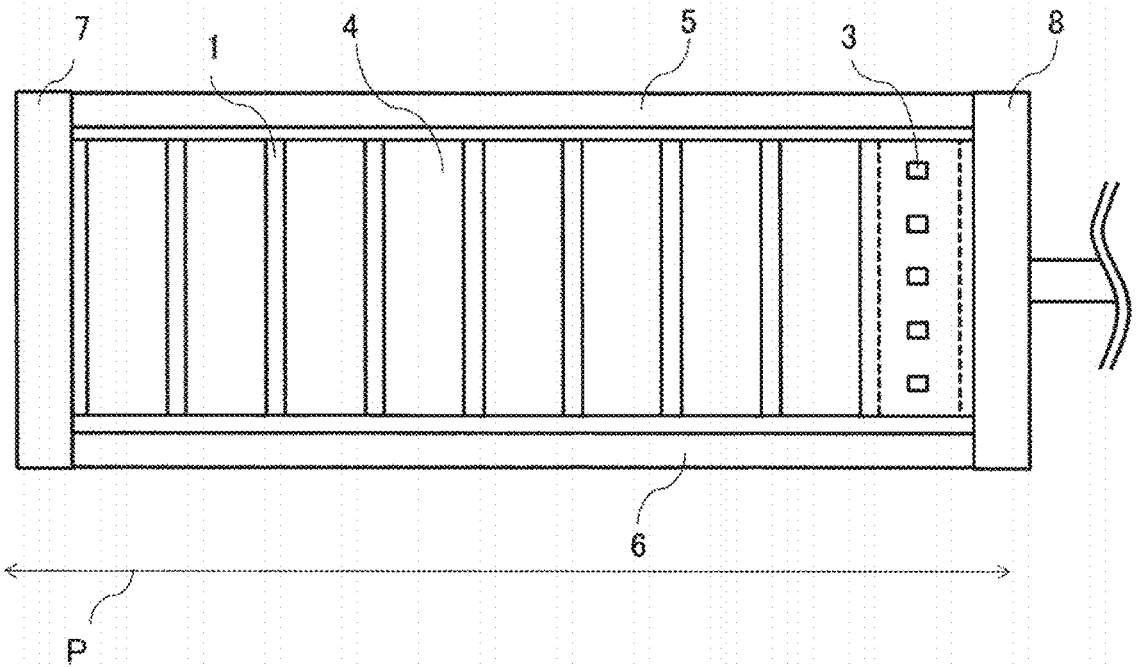
FIG. 3 is a plan view illustrating a schematic configuration of the solar power generation paddle according to Embodiment 1 of the present invention.

FIG. 1 is a side view illustrating a schematic configuration of a solar power generation paddle in a stored state according to Embodiment 1 to practice the present invention. FIGS. 2 and 3 are plan views each illustrating a schematic configuration of the solar power generation paddle in an extended state according to Embodiment 1 to practice the present invention. FIG. 2 illustrates a surface where solar battery cells are disposed. FIG. 3 illustrates a surface where thermoelectric conversion elements and heat dissipation members are disposed, in which a broken-line portion illustrates a state where a heat dissipation member has been removed. As illustrated in FIG. 1, a solar power generation paddle 100 is provided with a blanket 1, a plurality of solar battery cells 2 disposed on one surface of the blanket 1, and a plurality of thermoelectric conversion elements 3 disposed on the other surface of the blanket 1. A plurality of heat dissipation members 4 are disposed on surfaces of the thermoelectric conversion elements 3 which are opposite to the surfaces near the blanket 1, to cover the thermoelectric conversion elements 3.

As illustrated in FIGS. 2 and 3, the solar power generation paddle 100 is provided with a first extension mast 5 and a second extension mast 6 which have a function of storing the blanket 1 by taking up the blanket 1 into a roll, and extending the blanket 1 flat. The first extension mast 5 and the second extension mast 6 are arranged along, for example, an extending direction P, on two sides of the blanket 1. A substantially cylindrically columnar first support member 7 is attached to an end of the blanket 1 which is near a takeup start point. A substantially polygon-columnar second support member 8 is attached to an end, to be connected to a satellite structure (not shown), of the blanket 1, which is near a takeup terminal point.

The blanket 1 is taken up into a roll around the first support member 7 as the axis such that, for example, the surface where the solar battery cells 2 are disposed is located on an inner side in the radial direction and that the surface where the thermoelectric conversion elements 3 are disposed and which is covered with the heat dissipation members 4 is located on the outer side in the radial direction. By taking up the blanket 1 such that its surface where the solar battery cells 2 are disposed is located on the inner side in the radial direction, when, for example, solar battery cells 2 covered with cover glass are employed, the cover glass can be prevented from being broken by an external impact. The blanket 1 is formed by packaging, on a polyimide film having a thickness of, for example, 0.1 mm, wirings to supply power generated by the solar battery cells 2 and the thermoelectric conversion elements 3.

Figure 4:
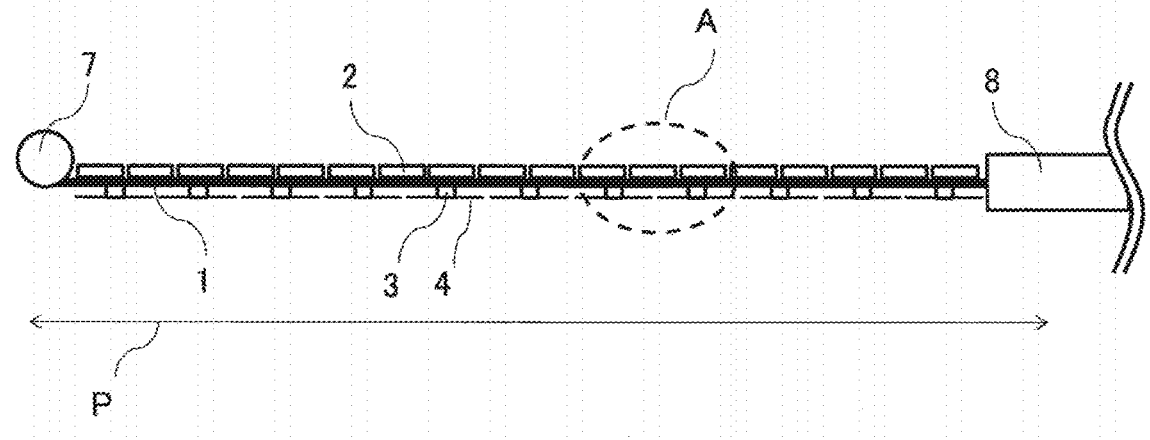
FIG. 4 is a side view illustrating a schematic configuration of the solar power generation paddle according to Embodiment 1 of the present invention.
Figure 5:
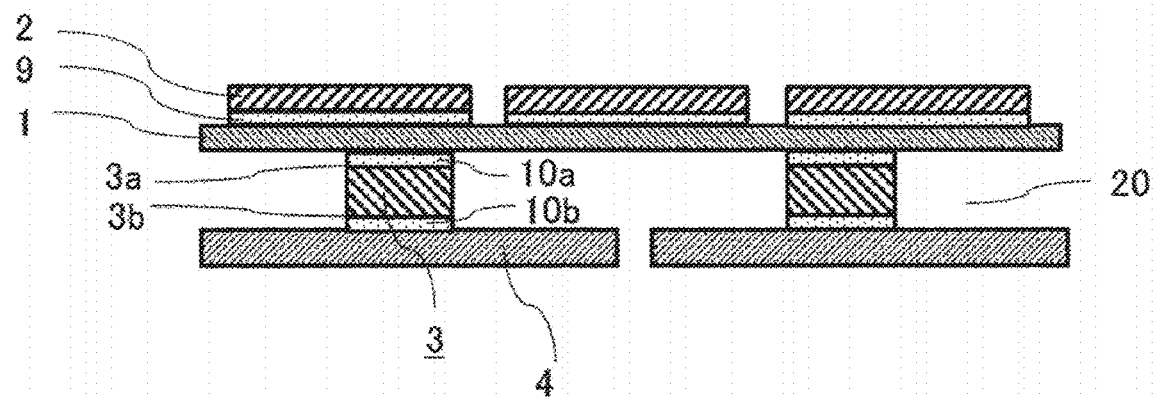
FIG. 5 is a sectional view illustrating a schematic configuration in enlargement of part of the solar power generation paddle according to Embodiment 1 of the present invention.

FIG. 4 is a side view illustrating a schematic configuration of the solar power generation paddle according to Embodiment 1 to practice the present invention. FIG. 5 is a sectional view illustrating a schematic configuration in enlargement of a portion indicated by a broken line A of FIG. 4. As illustrated in FIGS. 4 and 5, the solar battery cells 2 are adhered to one surface of the blanket 1 through an adhesive layer 9. The plurality of solar battery cells 2 disposed on the blanket 1 are electrically connected to each other to form a circuit. Power obtained by converting sunlight into an electric energy by the solar battery cells 2 is supplied to the satellite structure (not shown). Heat generated during conversion into power by the solar battery cells 2 and heat from sunlight are conducted to the thermoelectric conversion elements 3 through the blanket 1.

Each thermoelectric conversion element 3 has an element front surface 3a and an element rear surface 3b opposing the element front surface 3a. The element front surface 3a is adhered through an adhesive layer 10a to the blanket 1 which is heated to a high temperature by heat conducted from the solar battery cells 2. The element rear surface 3b is adhered through an adhesive layer 10b to the heat dissipation member 4 which is cooled to a low temperature by coldness of the space. The thermoelectric conversion element 3 generates power utilizing a temperature difference between the high-temperature element front surface 3a and the low-temperature element rear surface 3b. The larger the temperature difference, the larger the generated power. The plurality of thermoelectric conversion elements 3 disposed on the blanket 1 are connected to each other to form a circuit. Power generated by the thermoelectric conversion elements 3 is supplied to the satellite structure (not shown).

To form the thermoelectric conversion element 3, for example, an element fabricated by KELK Ltd. and having a longitudinal width of 7 to 8 mm, a transversal width of 7 to 8 mm, and a height of 1 mm, is utilized. To form the adhesive layer 9, the adhesive layer 10a, and the adhesive layer 10b, for example, a room-temperature-setting silicone adhesive is employed. In addition, any thermosetting resin with a high thermal conductivity can be employed. Also, a film-shaped resin may also be used.

When the blanket 1 is in an extended state, the heat dissipation members 4 are not in contact with the blanket 1 and are adhered only to the element rear surfaces 3b of the thermoelectric conversion elements 3 through the adhesive layers 10b. That is, gaps 20 are formed between the blanket 1 and the heat dissipation members 4 except for portions where the thermoelectric conversion elements 3 are arranged. The gaps 20 are heat-insulated in the vacuum. Therefore, heat conducted to the blanket 1 is mostly dissipated from the heat dissipation members 4 through the plurality of thermoelectric conversion elements 3 without being conducted to the gaps 20. Heat from the solar battery cells 2 can be conducted to the thermoelectric conversion elements 3 without being released, and can be collected with no waste. By providing the heat dissipation members 4 to the thermoelectric conversion elements 3 in this manner, the heat dissipation area of the thermoelectric conversion elements 3 can be increased, and the temperature difference between the element front surfaces 3a and the element rear surfaces 3b can be increased, so that the power to be obtained can be increased.

Figure 6:
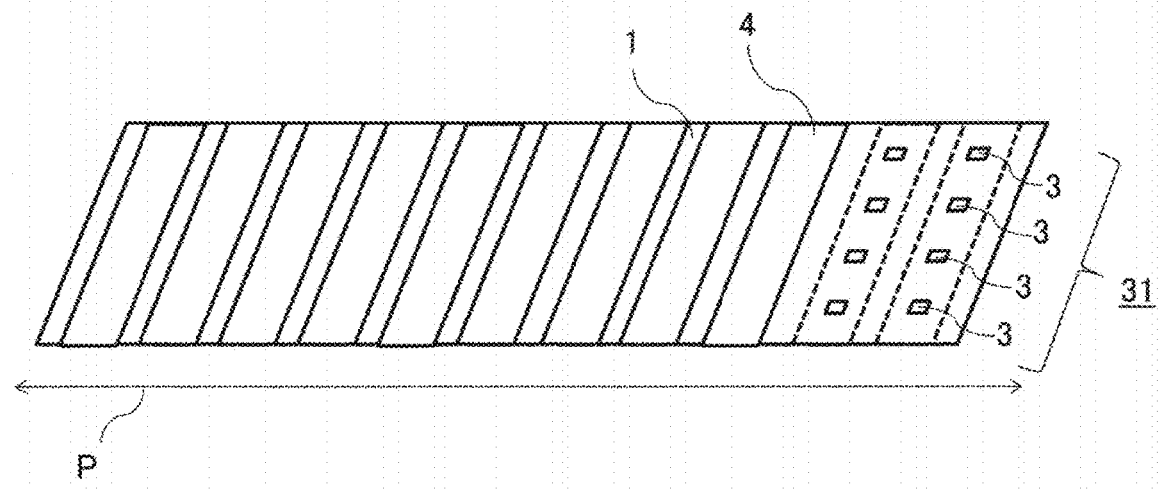
FIG. 6 is a perspective view illustrating a schematic configuration of the solar power generation paddle according to Embodiment 1 of the present invention.
Figure 7:
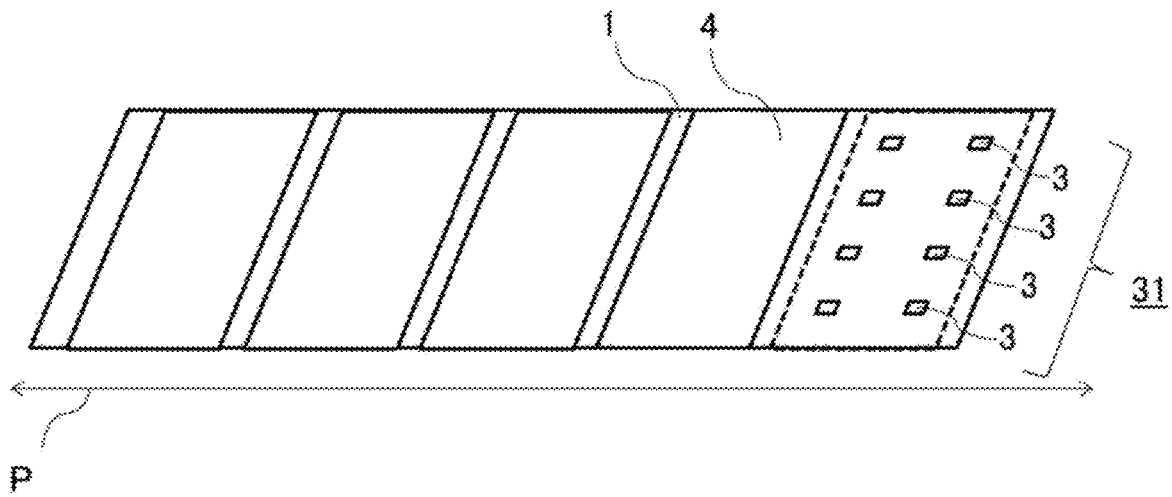
FIG. 7 is a perspective view illustrating a schematic configuration of the solar power generation paddle according to Embodiment 1 of the present invention.

FIG. 6 is a perspective view illustrating a schematic configuration of the solar power generation paddle according to Embodiment 1 to practice the present invention. Broken-line portions in FIG. 6 indicate a state where the heat dissipation members have been removed. The plurality of heat dissipation members 4 are disposed along the extending direction P of the first extension mast 5 and of the second extension mast 6. FIG. 6 illustrates a case in which one heat dissipation member 4 is provided for a group 31 of thermoelectric conversion elements 3 which are disposed to form one array in a direction perpendicular to the extending direction P. Alternatively, as illustrated in, for example, FIG. 7, one heat dissipation member 4 may be provided for a group 31 of thermoelectric conversion elements 3 which are disposed to form two arrays. The direction perpendicular to the extending direction P need not be strictly perpendicular. It suffices as far as the perpendicular direction is perpendicular enough such that the thermoelectric conversion elements 3 are covered by one heat dissipation member 4 having a predetermined width.

If a heat dissipation member 4 that forms one sheet to cover the entire blanket 1 is taken up into a roll, since the blanket 1 and the heat dissipation member 4 located on two sides sandwiching the thermoelectric conversion elements 3 have different curvatures, a shearing stress acts across the element front surfaces 3a and element rear surfaces 3b of the thermoelectric conversion elements 3. If a plurality of heat dissipation members 4 are disposed along the extending direction P, the shearing stress is prevented from acting on the thermoelectric conversion elements 3, so that dropping of and damage to the thermoelectric conversion elements 3 can be prevented.

Figure 8:
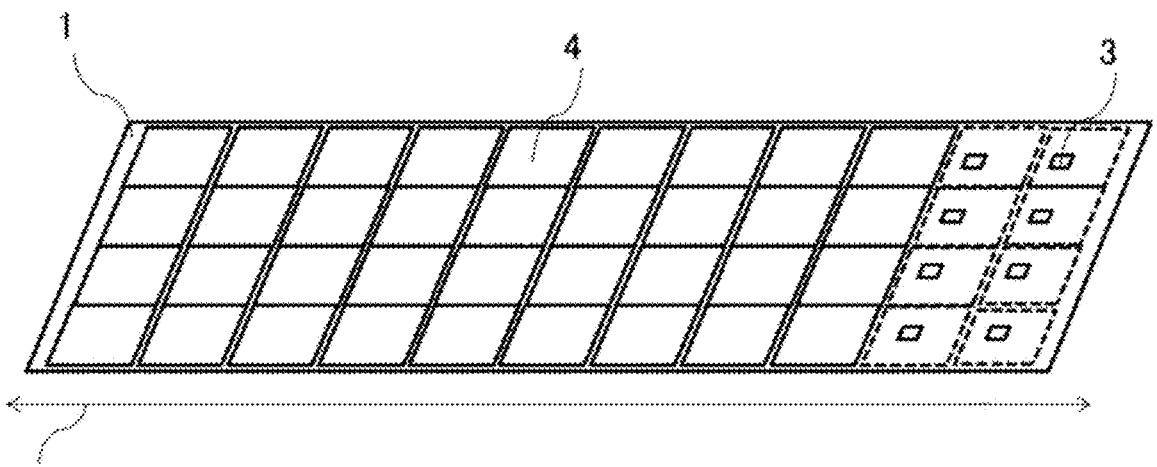
FIG. 8 is a perspective view illustrating a schematic configuration of the solar power generation paddle according to Embodiment 1 of the present invention.

A plurality of heat dissipation members 4 may be disposed in a direction perpendicular to the extending direction P. For example, as illustrated in FIG. 8, one heat dissipation member 4 is provided for one thermoelectric conversion element 3 out of thermoelectric conversion elements 3 disposed to form one array in a direction perpendicular to the extending direction P. By providing the plurality of heat dissipation members 4 in this manner along the direction perpendicular to the extending direction P, even if the blanket 1 is deformed in a direction perpendicular to the extending direction P, a shearing stress can be prevented from acting across the element front surfaces 3a and element rear surfaces 3b of the thermoelectric conversion elements 3, so that dropping of the thermoelectric conversion elements 3 can be prevented. The direction perpendicular to the extending direction P need not be strictly perpendicular. It suffices as far as the perpendicular direction is perpendicular enough such that at least two heat dissipation members 4 can be disposed.

The heat dissipation member 4 is made of, for example, carbon fiber reinforced plastic formed into a flat plate having a thickness of 0.1 mm. The heat dissipation members 4 suffice as far as they are rigid enough not to come into contact with the blanket 1 when the blanket 1 is extended. For example, a polyimide film having a thickness of 0.05 mm may be used.

Figure 9:
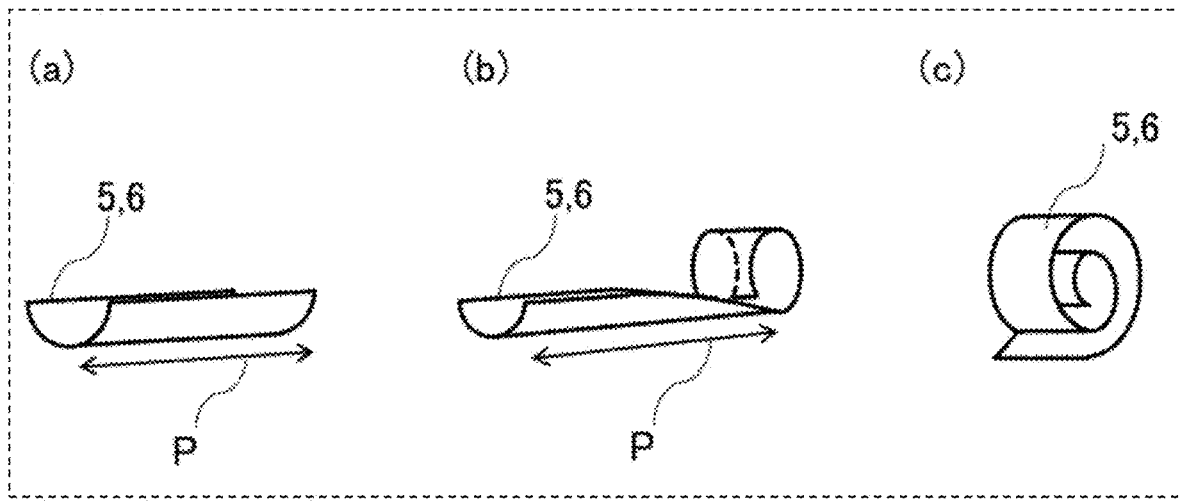
FIG. 9 includes explanatory diagrams each describing an extension mast of the solar power generation paddle according to Embodiment 1 of the present invention.

FIG. 9 includes explanatory diagrams each describing first and second extension masts of the solar power generation paddle according to Embodiment 1 to practice the present invention. In FIG. 9, (a) illustrates the first and second extension masts in an extended state, (b) illustrates the first and second extension masts in transition from the extended direction to the stored state, and (c) illustrates the first and second extension masts in the stored state. As illustrated in (a) of FIG. 9, when the blanket 1 is in the extended state, the first extension mast 5 and the second extension mast 6 have a boom-like shape being curled semi-cylindrically. As illustrated in (c) of FIG. 9, when the blanket 1 is in the stored state, the first extension mast 5 and the second extension mast 6 have a roll shape as they are taken up into rolls. The shape of the first extension mast 5 and the shape of the second extension mast 6 can be maintained between the boom-like shape and the roll shape.

When the blanket 1 makes transition from the extended state to the stored state, an elastic strain energy is accumulated in the first extension mast 5 and the second extension mast 6, as illustrated in (b) of FIG. 9. The first extension mast 5 and the second extension mast 6 extend as they release the accumulated elastic strain energy. Therefore, when the first extension mast 5 and the second extension mast 6 are arranged on, for example, the two sides of the blanket 1, they can make the blanket 1 stored and extended without requiring of a special driving device.

The first extension mast 5 and the second extension mast 6 are formed of high-elasticity members, and use, for example, carbon fiber reinforced plastic having a thickness of 0.2 mm.

The first support member 7 having a substantially cylindrically columnar shape and the second support member 8 having a substantially polygon-columnar shape are attached to two ends in the extending direction P of each of the blanket 1, the first extension mast 5, and the second extension mast 6. The substantially cylindrically columnar shape includes a column whose section forms an ellipse, in addition to a column whose section taken along a plane perpendicular to the axial direction forms a complete round. The substantially polygon-columnar shape includes a column whose polygonal corners are rounded. The blanket 1, the first extension mast 5, and the second extension mast 6 are stored as they are taken up into a roll around the first support member 7 as the axis.

By supporting the two ends of the blanket 1 with the first support member 7 and the second support member 8, the posture of the solar power generation paddle 100 can be controlled stably. To form the first support member 7 and the second support member 8, for example, carbon fiber reinforced plastic is employed.

As described above, the solar power generation paddle 100 according to the present embodiment is provided with the blanket 1, the first extension mast 5 and the second extension mast 6 which have a function of storing, by taking up, the blanket 1 into a roll and a function of extending the blanket 1, the solar battery cells 2 disposed on one surface of the blanket 1, the thermoelectric conversion elements 3 disposed on the other surface of the blanket 1, and the plurality of heat dissipation members 4 disposed on surfaces of the thermoelectric conversion elements 3 which are opposite to the surfaces near the blanket 1, along the extending direction P of the first extension mast 5 and the second extension mast 6. By this, while increasing the heat dissipation area of the thermoelectric conversion elements 3 and increasing the temperature difference between the element front surfaces 3a and the element rear surfaces 3b as much as possible, a shearing stress is prevented from acting on the thermoelectric conversion elements 3 disposed between the blanket 1 and the heat dissipation members 4. Thus, dropping of the thermoelectric conversion elements 3 from the blanket 1 and damage to the thermoelectric conversion elements 3 can be prevented, so that the power to be generated can be increased.

Figure 10:
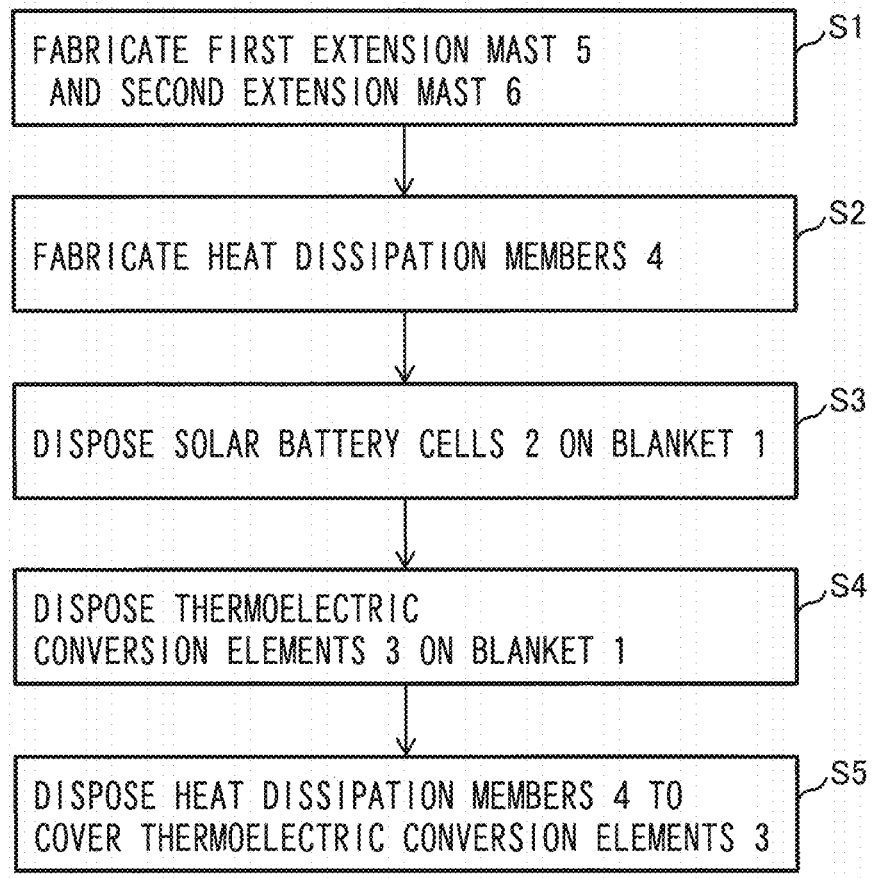
FIG. 10 is a flowchart illustrating manufacturing processing of the solar power generation paddle according to Embodiment 1 of the present invention.
Figure 11:
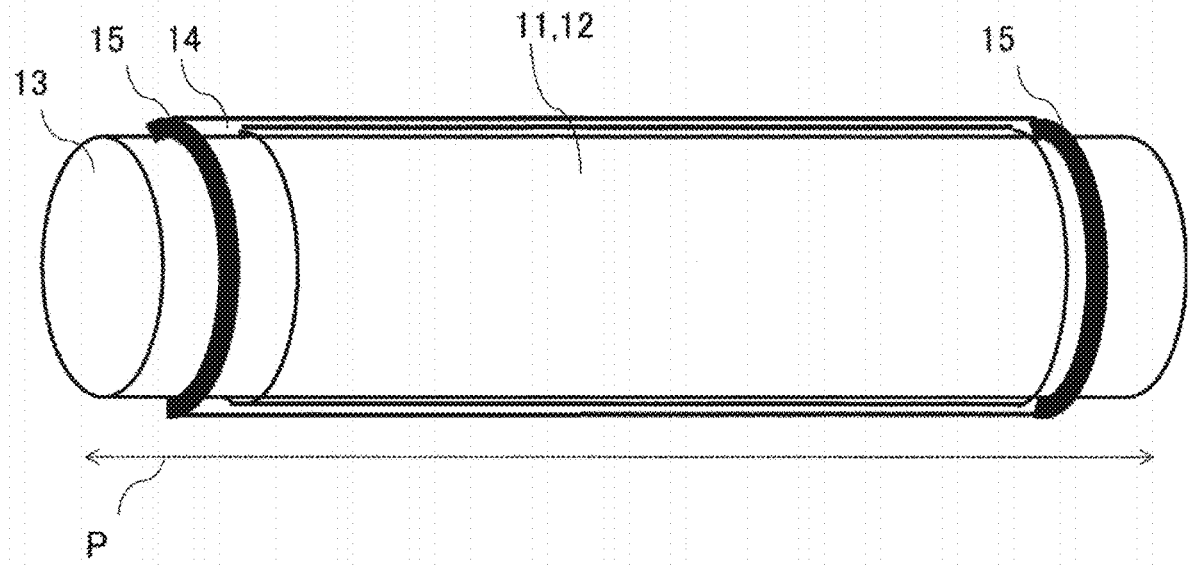
FIG. 11 is an explanatory diagram illustrating one process of manufacturing the solar power generation paddle according to Embodiment 1 of the present invention.
Figure 12:
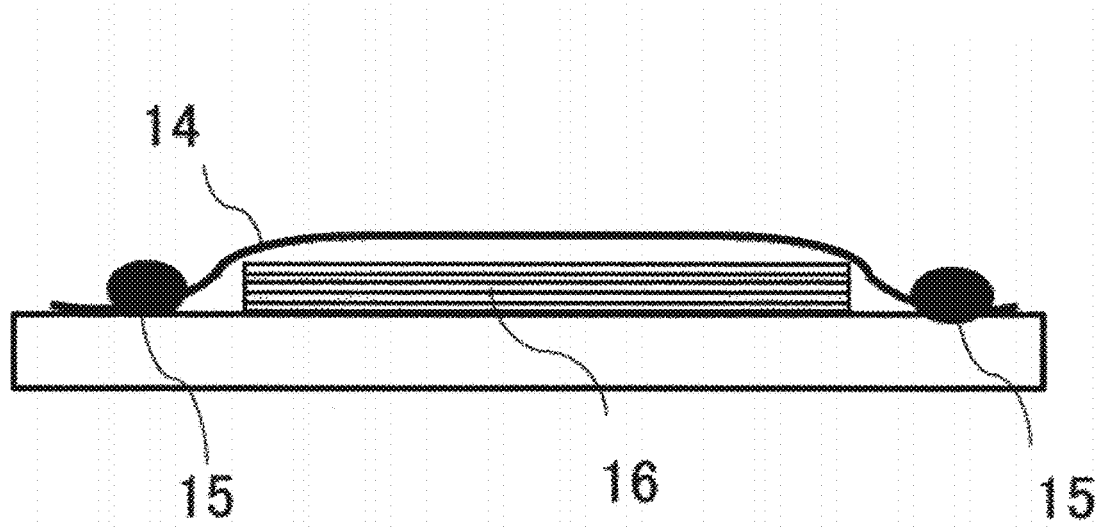
FIG. 12 is an explanatory diagram illustrating one process of manufacturing the solar power generation paddle according to Embodiment 1 of the present invention.
Figure 13:
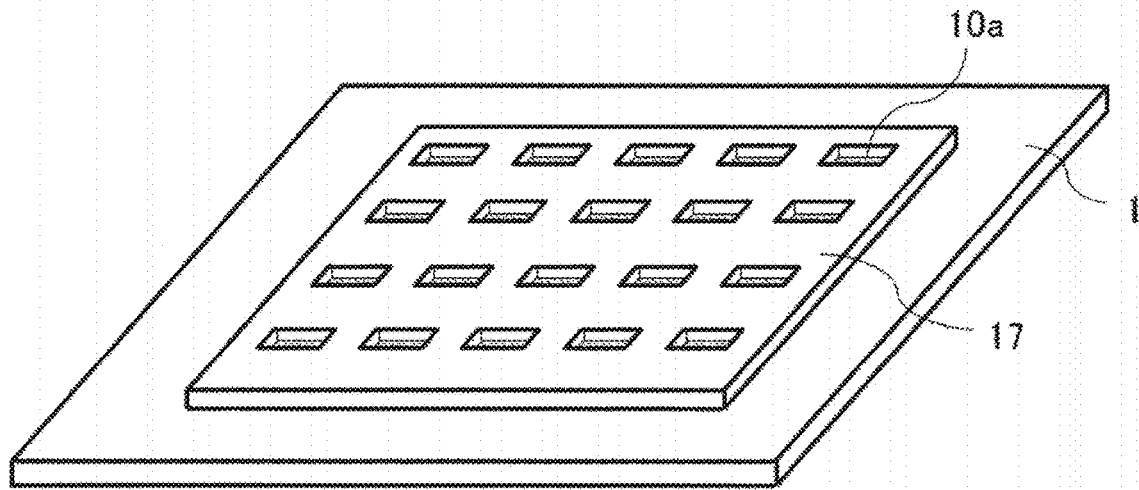
FIG. 13 is an explanatory diagram illustrating one process of manufacturing the solar power generation paddle according to Embodiment 1 of the present invention.

A method of manufacturing the solar power generation paddle 100 in Embodiment 1 to practice the present invention will be described. FIG. 10 is a flowchart illustrating manufacturing processing according to Embodiment 1 to practice the present invention. FIGS. 11 to 13 are explanatory diagrams each illustrating one process of manufacturing the solar power generation paddle according to Embodiment 1 to practice the present invention.

In step S1, the first extension mast 5 and the second extension mast 6 of the solar power generation paddle 100 are fabricated. First, a plurality of prepregs, which are half-set sheets fabricated by impregnating carbon fibers with a resin, are laminated to form a first extension mast prepreg laminate 11 and a second extension mast prepreg laminate 12.

The first extension mast prepreg laminate 11 and the second extension mast prepreg laminate 12 are wound around substantially cylindrically columnar shaft members 13. At this time, a direction of winding around the shaft members 13 is a direction perpendicular to the extending direction P.

Then, as illustrated in FIG. 11, with the first extension mast prepreg laminate 11 and the second extension mast prepreg laminate 12 being wound around the shaft members 13, each laminate is entirely covered with a bagging film 14 and is sealed with a seal member 15. After sealing with the seal member 15, a pump (not illustrated) is actuated to exhaust internal air covered with the bagging film 14, so as to set the first extension mast prepreg laminate 11 and the second extension mast prepreg laminate 12 in a reduced-pressure state.

Subsequently, the first extension mast prepreg laminate 11 and the second extension mast prepreg laminate 12 are placed in an autoclave, and are pressurized and heated from outside the bagging film 14. For example, under 3 atmospheric pressure, a temperature of 120° C. is held for 3 hours.

The first extension mast prepreg laminate 11 and the second extension mast prepreg laminate 12 are taken out from the autoclave, and the shaft member 13, the bagging film 14, and the seal member 15 are removed. Both the first extension mast 5 and the second extension mast 6 can thus be fabricated.

A condition under which the first extension mast prepreg laminate 11 and the second extension mast prepreg laminate 12 are heated under pressurization varies depending on the type of the resin that forms the first extension mast prepreg laminate 11 and the second extension mast prepreg laminate 12.

In step S2, the heat dissipation members 4 are fabricated. A plurality of prepregs are laminated in the same manner as in fabrication of the first extension mast 5 and the second extension mast 6, to form a heat-dissipation-member prepreg laminate 16. Furthermore, as illustrated in FIG. 12, the heat-dissipation-member prepreg laminate 16 is covered with a bagging film 14, is then sealed with a seal member 15, and is set in a reduced-pressure state by actuating the pump (not illustrated). Subsequently, while maintaining the reduced-pressure state inside the bagging film, the heat-dissipation-member prepreg laminate 16 is placed in the autoclave, and is pressurized and heated from outside the bagging film 14. For example, under 3 atmospheric pressure, a temperature of 120° C. is held for 3 hours.

The heat-dissipation-member prepreg laminate 16 is taken out from the autoclave, and the bagging film 14 and the seal member 15 are removed. The heat dissipation members 4 can thus be fabricated. A case has been described in which the heat dissipation members 4 are made of fiber reinforced plastic using a prepreg. When, for example, a polyimide film is used as the heat dissipation members 4, step S2 can be omitted.

In step S3, the plurality of solar battery cells 2 are disposed on one surface of the blanket 1 through the adhesive layers 9.

In step S4, the thermoelectric conversion elements 3 are disposed on the other surface of the blanket 1 through the adhesive layers 10*a*. For example, as illustrated in FIG. 13, a frame member 17 formed with a plurality of grooves almost corresponding to a thickness of the thermoelectric conversion elements 3 is placed on the blanket 1, and a room-temperature-setting silicone adhesive is applied to the grooves of the frame member 17 to form the adhesive layers 10*a*. The plurality of thermoelectric conversion elements 3 are disposed on the adhesive layers 10*a*.

In step S5, the plurality of heat dissipation members 4 are disposed along the extending direction P, on surfaces of the thermoelectric conversion elements 3 which are opposite to the surfaces near the blanket 1, through the adhesive layers 10*b*, to cover the thermoelectric conversion elements 3. The adhesive layers 10*b* are formed by coating on the upper surfaces of the thermoelectric conversion elements 3 in the frame member 17 placed on the blanket 1, and then the frame member 17 is removed. The heat dissipation members 4 are horizontally placed on the adhesive layers 10*b* of the thermoelectric conversion elements 3 disposed on the blanket 1, and the thermoelectric conversion elements 3 and the heat dissipation members 4 are adhered through the adhesive layers 10*b*. At this time, a plurality of spacers (not illustrated) having the same thickness as that of the thermoelectric conversion elements 3 are attached to the blanket 1 at predetermined intervals, to form the gaps 20 between the blanket 1 and the heat dissipation members 4.

The first support member 7 and the second support member 8 are attached to two ends in the extending direction P of each of the blanket 1, the first extension mast 5, and the second extension mast 6. The solar power generation paddle 100 is thus obtained.

The order of the above processes may be partly changed, such that the solar battery cells 2 are disposed after the thermoelectric conversion elements 3 are disposed on the blanket 1. Also, for example, the frame member 17 may be placed on the heat dissipation members 4, the thermoelectric conversion elements 3 may then be disposed, and after that the blanket 1 may be attached.

As described above, the method of manufacturing the solar power generation paddle 100 includes: a step of forming the first extension mast 5 and the second extension mast 6, each by laminating the plurality of prepregs, winding the prepregs around the shaft member and covering the prepregs with the bagging film 14, and pressurizing and heating the prepregs from outside the bagging film 14; a step of disposing the solar battery cells 2 on one surface of the blanket 1; a step of disposing the thermoelectric conversion elements 3 on the other surface of the blanket 1; and a step of disposing the plurality of heat dissipation members 4 on surfaces of the thermoelectric conversion elements 3 which are opposite to the surfaces near the blanket 1, along the extending direction P. As a result, the solar power generation paddle 100 can be manufactured with simple procedures.

Figure 14:
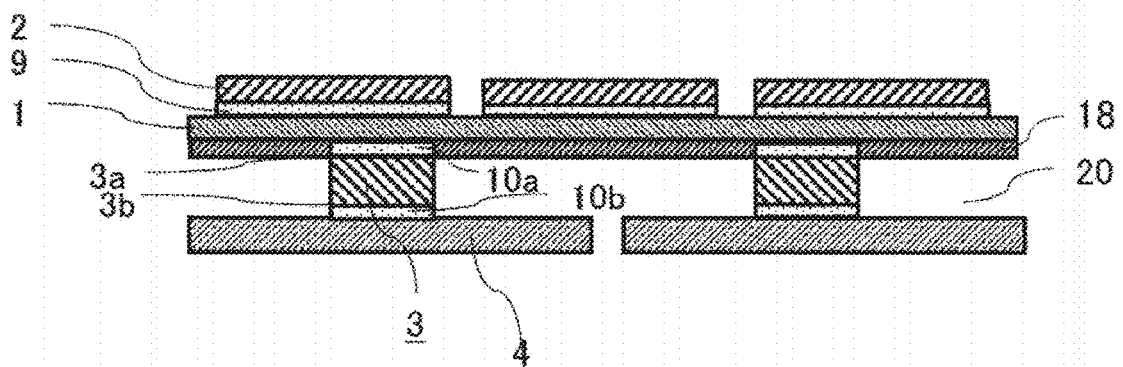
FIG. 14 is a sectional view illustrating a schematic configuration in enlargement of part of the solar power generation paddle according to Embodiment 1 of the present invention.

It is more preferable if, in the solar power generation paddle 100, as illustrated in FIG. 14, a radiation heat insulating member 18 is further provided to, of the surface of the blanket 1 which is opposite to the surface where the solar battery cells 2 are disposed, a surface where the thermoelectric conversion elements 3 are not arranged.

By providing the radiation heat insulating member 18 to the blanket 1, heat conducted from the solar battery cells 2 can be prevented from being dissipated by radiation from the surface of the blanket 1 where the thermoelectric conversion elements 3 are not disposed. The radiation heat insulating member 18 suffices as far as it is made of a material whose emissivity is smaller than that of the heat dissipation members 4. For example, an aluminum foil tape manufactured by 3M Company can be used.

Figure 15:
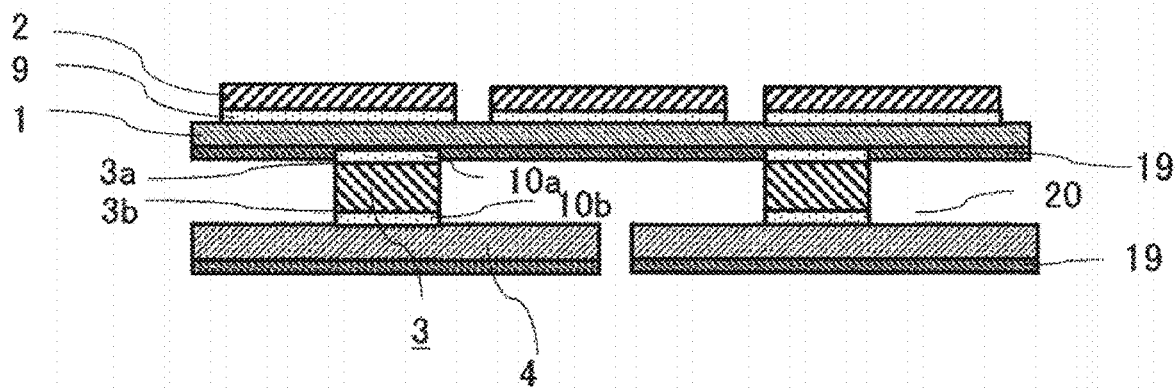
FIG. 15 is a sectional view illustrating a schematic configuration in enlargement of part of the solar power generation paddle according to Embodiment 1 of the present invention.

It is also more preferable if, in the solar power generation paddle 100, high-heat conduction sheet 19 is provided to at least either the blanket 1 or each of the heat dissipation members 4, as illustrated in FIG. 15. The high-heat conduction sheet 19 is formed on at least either a surface of the blanket 1 where the thermoelectric conversion elements 3 are disposed, or surfaces of the heat dissipation members 4 which are opposite to the surfaces where the thermoelectric conversion elements 3 are disposed. By this, thermal conductivity within the surface the blanket 1 and within the surfaces of the heat dissipation members 4 can be enhanced, so that heat can be distributed to the plurality of disposed thermoelectric conversion elements 3 individually. The high-heat conduction sheet 19 suffices as far as it is made of a material whose thermal conductivity is larger than that of the blanket 1 and that of the heat dissipation member 4. For example, a graphite sheet manufactured by Panasonic Corporation can be used.

Embodiment 2

Figure 16:
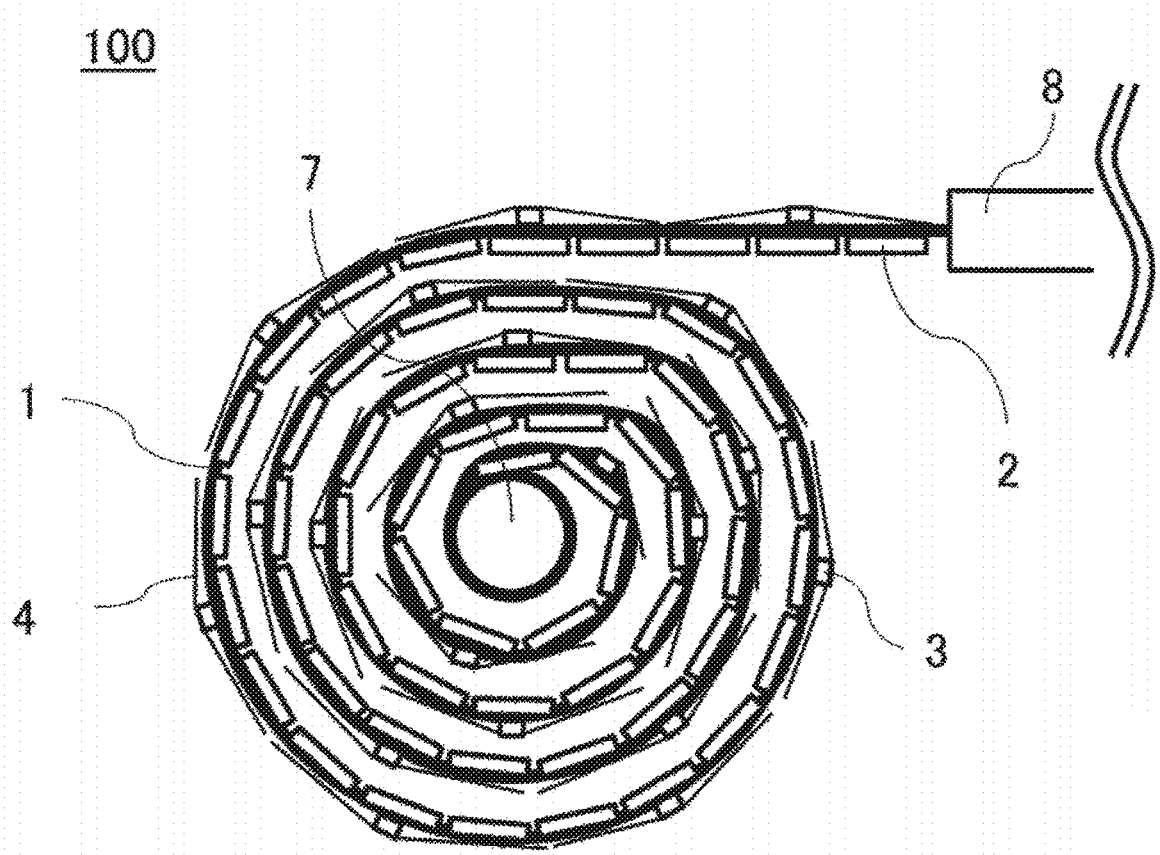
FIG. 16 is a side view illustrating a schematic configuration of a solar power generation paddle according to Embodiment 2 of the present invention.
Figure 17:
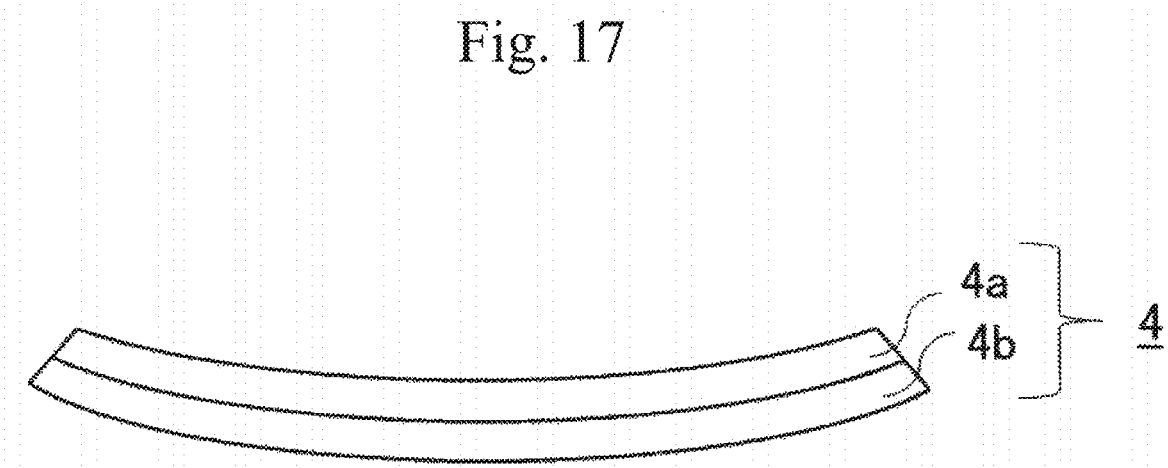
FIG. 17 is a side view illustrating a schematic configuration of a heat dissipation member of the solar power generation paddle according to Embodiment 2 of the present invention.
Figure 18:
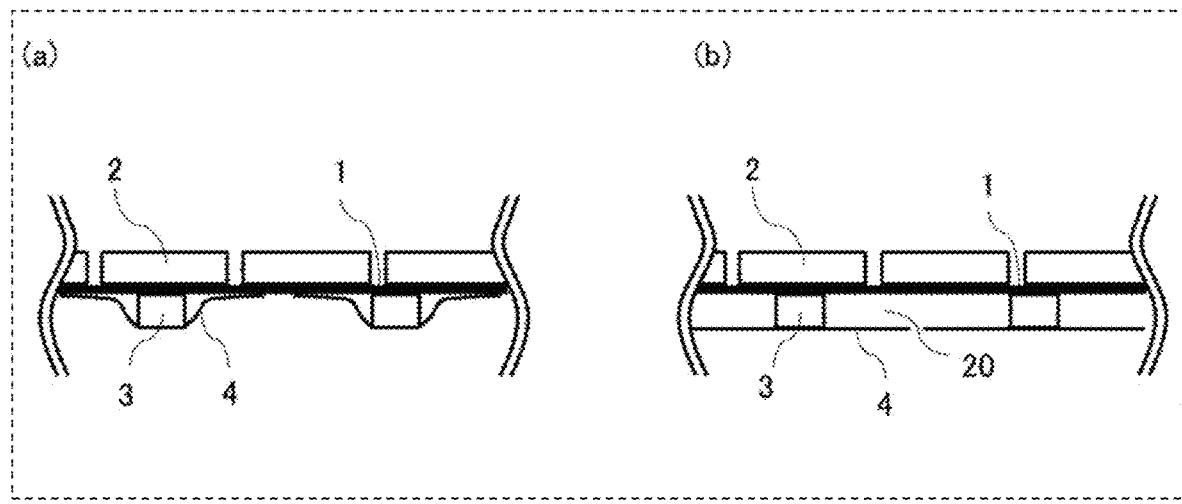
FIG. 18 includes explanatory diagrams each describing the heat dissipation members of the solar power generation paddle according to Embodiment 2 of the present invention.

A solar power generation paddle according to Embodiment 2 to practice the present invention will be described with referring to FIG. 16 to FIG. 18. In FIG. 16 to FIG. 18, the same reference sign as in FIG. 1 denotes the same or equivalent portion. Below, a description on the same respect as that of Embodiment 1 will be omitted, and a difference from Embodiment 1 will mainly be described.

FIG. 16 is a side view illustrating a schematic configuration of the solar power generation paddle according to Embodiment 2 to practice the present invention. As illustrated in FIG. 16, in a solar power generation paddle 100, a plurality of solar battery cells 2 are disposed on one surface of a blanket 1, and a plurality of thermoelectric conversion elements 3 are disposed on the other surface of the blanket 1. A plurality of heat dissipation members 4 are disposed on surfaces of the thermoelectric conversion elements 3 which are opposite to the surfaces near the blanket 1, along an extending direction P. In a stored state where the blanket 1 is taken up into a roll, two sides of each heat dissipation member 4 that sandwich the thermoelectric conversion elements 3 are bent toward the blanket 1.

FIG. 17 is a side view illustrating a schematic configuration of a heat dissipation member of the solar power generation paddle according to Embodiment 2 to practice the present invention. As illustrated in, for example, FIG. 17, the heat dissipation member 4 is formed by laminating layers 4a and 4b having different thermal expansion coefficients, in a direction of thickness. When a temperature change is applied to the heat dissipation member 4, a convex warp occurs in the heat dissipation member 4 due to a difference in thermal expansion coefficient. The heat dissipation member 4 is made of, for example, carbon fiber reinforced plastic, in which carbon fibers are oriented such that the thermal expansion coefficient of a surface of the heat dissipation member 4 which is near the thermoelectric conversion element 3 is larger than the thermal expansion coefficient of the surface of the heat dissipation member 4 which is opposite to the surface near the thermoelectric conversion element 3. FIG. 17 illustrates a case in which the heat dissipation member 4 is a two-layer member. However, it suffices as far as the thermal expansion coefficient in the heat dissipation member 4 varies enough in the direction of thickness such that a warp occurs. The heat dissipation member 4 may be, for example, a three-layer member or a four-layer member.

FIG. 18 includes explanatory diagrams each describing the heat dissipation member of the solar power generation paddle according to Embodiment 2 to practice the present invention. In FIG. 18, (a) illustrates heat dissipation members in a room temperature, and (b) illustrates heat dissipation members in a low temperature. As illustrated in (a) of FIG. 18, in a room temperature of, for example, about 25° C., each heat dissipation member 4 has a shape whose two ends sandwiching the thermoelectric conversion element 3 are bent toward the blanket 1. Also, as illustrated in (b) of FIG. 18, in a low temperature of, for example, about 0° C., the warp of the heat dissipation member 4 is restored to a flat shape, so that its two ends separate from the blanket 1. FIG. 18 illustrates a case in which one heat dissipation member 4 sandwiches one thermoelectric conversion element 3. However, one heat dissipation member 4 may be provided to two or three thermoelectric conversion elements 3.

In the room temperature, two ends of the heat dissipation member 4 that sandwich the thermoelectric conversion element 3 are bent toward the blanket 1. This shape prevents dropping of and damage to the thermoelectric conversion element 3 more in the stored state, and facilitates take-up. When the blanket 1 is extended in a low-temperature space, the heat dissipation member 4 becomes flat and is not in contact with the blanket 1, but is adhered only to the element rear surface 3b of the thermoelectric conversion element 3. Therefore, good heat dissipation properties can be secured.

As described above, by disposing the plurality of heat dissipation members 4 on the surfaces of the thermoelectric conversion elements 3 which are opposite to the surfaces near the blanket 1, along the extending direction P, dropping of and damage to the thermoelectric conversion elements 3 can be prevented while securing the temperature difference between the element front surfaces 3a and the element rear surfaces 3b. Furthermore, the present embodiment uses the heat dissipation members 4 each formed by laminating layers having different thermal expansion coefficients in the direction of thickness. This facilitates takeup for storing in a room temperature, and secures good heat dissipation properties after extension, so that larger power can be obtained from the thermoelectric conversion elements 3.

It is preferable if the heat dissipation member 4 is flexible enough such that in the room temperature where the two ends of the heat dissipation member 4 are bent toward the blanket 1, when the heat dissipation member 4 comes into contact with the blanket 1, a crack or a tear will not be formed in the blanket 1. At this time, the heat dissipation member 4 contains a polypropylene resin having a glass transition temperature in the vicinity of, for example, 0° C. Thus, even if the blanket 1 is exposed to a low temperature after being taken up, it can maintain its roll shape.

Embodiment 3

Figure 19:
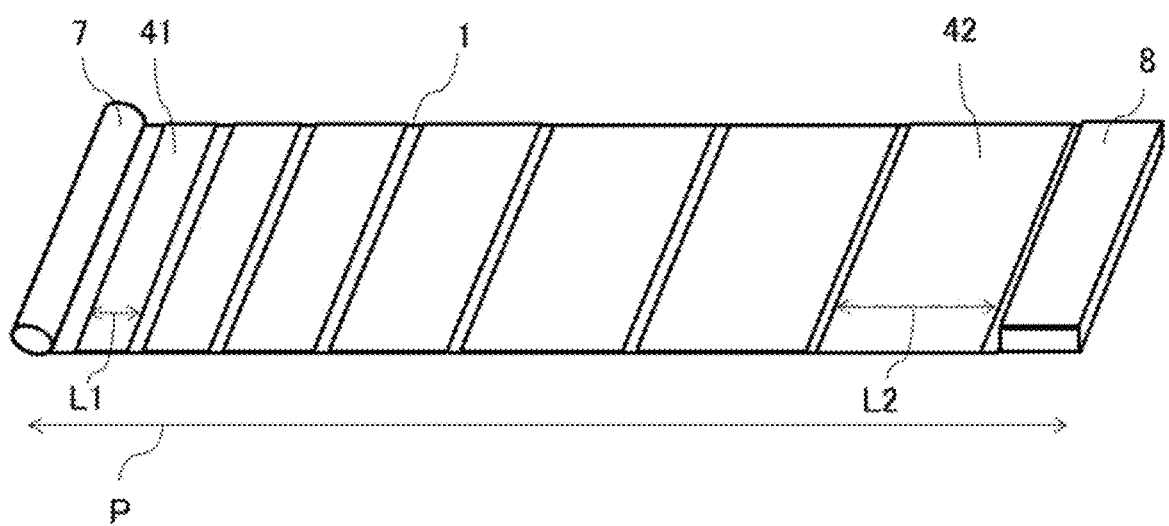
FIG. 19 is a perspective view illustrating a schematic configuration of a solar power generation paddle according to Embodiment 3 of the present invention.

A solar power generation paddle according to Embodiment 3 to practice the present invention will be described with referring to FIG. 19. In FIG. 19, the same reference sign as in FIG. 1 denotes the same or equivalent portion. Below, a description on the same respect as that of Embodiment 1 will be omitted, and a difference from Embodiment 1 will mainly be described.

FIG. 19 is a perspective view illustrating a schematic configuration of the solar power generation paddle according to Embodiment 3 to practice the present invention. As illustrated in FIG. 19, a plurality of heat dissipation members 4 are disposed along an extending direction P. A width L1, along the extending direction P, of a heat dissipation member 41 arranged near a first support member 7 serving as a takeup start point is smaller than a width L2, along the extending direction P, of a heat dissipation member 42 arranged near a second support member 8 serving as a takeup terminal point. That is, when a blanket 1 is taken up into a roll, a small-width heat dissipation member 41 is located at a position on an inner side in the radial direction where a change in curvature is large, and a large-width heat dissipation member 42 is located at a position on an outer side in the radial direction where a change in curvature is small.

As described above, by disposing the plurality of heat dissipation members 4 on surfaces of thermoelectric conversion elements 3 which are opposite to surfaces near the blanket 1, along the extending direction P, dropping of and damage to the thermoelectric conversion elements 3 can be prevented while a temperature difference between element front surfaces 3a and element rear surfaces 3b can be secured. Furthermore, in the present embodiment, the width L1, along the extending direction P, of the heat dissipation member 41 near the first support member 7 serving as the takeup start point is smaller than the width L2, along the extending direction P, of the heat dissipation member 42 near the second support member 8. With this structure, a heat dissipation area can be increased while a shearing stress is prevented from acting on the thermoelectric conversion elements 3 sandwiched between the blanket 1 and the heat dissipation member 4 having different curvatures.

Embodiment 4

Figure 20:
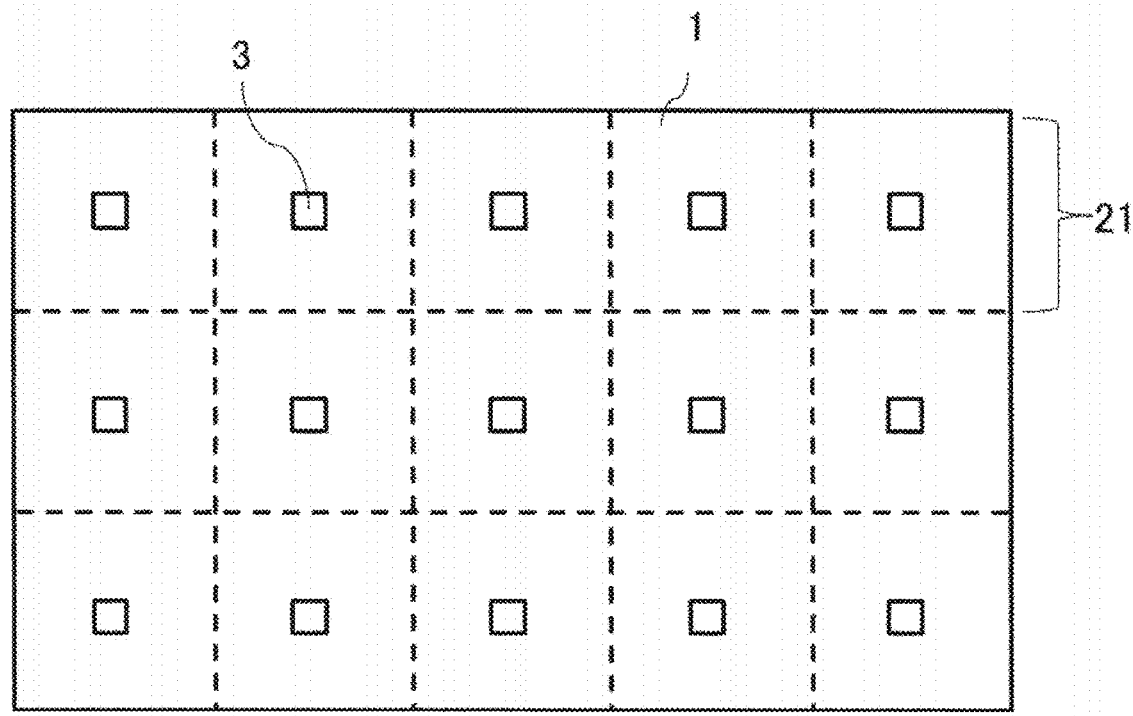
FIG. 20 is an explanatory diagram for describing layout of thermoelectric conversion elements of a solar power generation paddle according to Embodiment 4 of the present invention.

A solar power generation paddle 100 according to Embodiment 4 to practice the present invention will be described with referring to FIG. 20. FIG. 20 is an explanatory diagram for describing layout of thermoelectric conversion elements of the solar power generation paddle according to Embodiment 4 to practice the present invention. In FIG. 20, the same reference sign as in FIG. 1 denote the same or equivalent portion.

In Embodiment 1, the plurality of thermoelectric conversion elements 3 are disposed arbitrarily on the blanket 1. In contrast, in the present embodiment, a blanket 1 is divided into a plurality of regions 21 having equal areas, and at least one thermoelectric conversion element 3 is disposed in each region 21.

For example, as illustrated in FIG. 20, the blanket 1 is divided into a plurality of equal regions 21 each having an area "a", and one thermoelectric conversion element 3 having an element area "b" is disposed at a central position of each region 21. In the solar power generation paddle 100, heat which is generated when sunlight being made incident uniformly on the plurality of solar battery cells 2 disposed on the blanket 1 is converted into power, is conducted to the blanket 1 uniformly. By providing each of the uniform regions 21 with at least one thermoelectric conversion element 3 in this manner, heat uniformly conducted to the blanket 1 can be equally distributed to the thermoelectric conversion elements 3 and can be efficiently converted into power. Equal mentioned here need not be strictly equal. For example, an area of one region 21 may be larger than an area of another region 21.

The plurality of thermoelectric conversion elements 3 must be disposed on the blanket 1 with an appropriate packing factor, to secure a sufficient temperature difference between the temperature of the element front surfaces 3a and the element rear surfaces 3b. The packing factor is a ratio of the total area of the element front surfaces 3a or element rear surfaces 3b of the plurality of thermoelectric conversion elements 3 to an area of the blanket 1.

The larger a number of thermoelectric conversion elements 3 is, the more the power can be increased. Meanwhile, heat of sunlight is almost stable between 1289 W/m$^2$ and 1421 W/m$^2$. If the number of thermoelectric conversion elements 3 is increased and accordingly a contact area of the thermoelectric conversion elements 3 with the area of the blanket 1 is increased, heat per unit area passing through one thermoelectric conversion element 3 is reduced, so that a temperature difference between the temperature of the element front surface 3a and the temperature of the element rear surface 3b will not occur easily.

To verify an appropriate packing factor, the solar power generation paddle 100 was used to measure power which is generated by the plurality of thermoelectric conversion elements 3 when a ratio B/A of a total area B of the element front surfaces 3a of the plurality of thermoelectric conversion elements 3 to an area A of the blanket 1 was changed. Specifically, the solar power generation paddle 100 was placed in a vacuum container capable of maintaining a vacuum (for example, 0.001 Pa or less) and a low temperature. Light from a Xenon lamp as a light source was made incident on solar battery cells 2. Power of the thermoelectric conversion elements 3 was measured by a DC-voltage current source monitor manufactured by Advantest Corporation. Also, the temperature difference between the element front surfaces 3a and the element rear surfaces 3b was measured with using a thermocouple.

Figure 21:
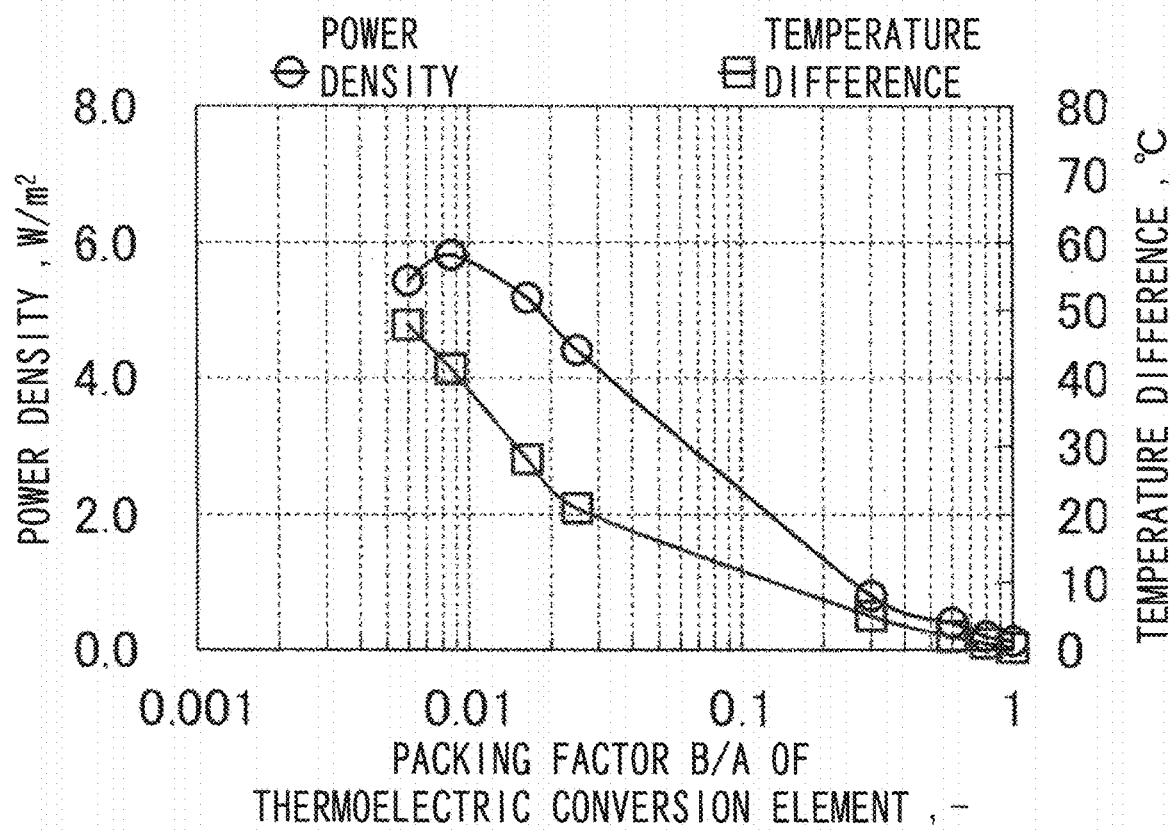
FIG. 21 is a diagram illustrating a relationship among a packing factor of the thermoelectric conversion elements of the solar power generation paddle according to Embodiment 4 of the present invention, power generated per unit area, and a temperature difference between an element front surface and an element rear surface.

FIG. 21 is a diagram illustrating a relationship among the packing factor of the thermoelectric conversion elements of the solar power generation paddle according to Embodiment 4 to practice the present invention, power generated per unit area, and a temperature difference between the element front surfaces and the element rear surfaces. According to FIG. 21, when the packing factor is 0.3 or less, the temperature difference increases, and the power increases accordingly. When the packing factor is 0.006 or more to 0.03 or less, the temperature difference can be increased more remarkably, and the power can be increased. When the packing factor is 0.008 or more to 0.01 or less, the power becomes the maximum.

For example, when an area "a" of the region 21 of the blanket 1 is 30 cm$^2$ and an element area "b" of one thermoelectric conversion element 3 is 0.27 cm$^2$, the packing factor of the thermoelectric conversion elements 3 with respect to the blanket 1 is 0.009, and power generated per unit area of the thermoelectric conversion element 3 is 5.8 W/cm$^2$.

The above result indicates that when the plurality of thermoelectric conversion elements 3 are disposed such that the packing factor falls within a range of more than 0 to 0.3 or less, the temperature difference between the temperature of the element front surfaces 3a and the temperature of the element rear surfaces 3b can be increased, and the power to be generated can be increased. If the number of thermoelectric conversion elements 3 decreases and the packing factor decreases, even if the temperature difference can be secured, the power to be generated decreases. Therefore, it is preferable to set the packing factor of the thermoelectric conversion elements 3 to fall within a range of 0.006 or more to 0.03 or less.

As described above, by disposing the plurality of heat dissipation members 4 on the surfaces of the thermoelectric conversion elements 3 which are opposite to the surfaces near the blanket 1, along the extending direction P, dropping of and damage to the thermoelectric conversion elements 3 can be prevented while the temperature difference between the element front surfaces 3a and element rear surfaces 3b of the thermoelectric conversion elements 3 is secured. Furthermore, in the present embodiment, by disposing at least one thermoelectric conversion element 3 on each of the plurality of regions 21 having equal areas, heat from the solar battery cells 2 can be conducted to the plurality of thermoelectric conversion elements 3 equally, so that the power to be generated by the thermoelectric conversion elements 3 can be increased. Also, by arranging the thermoelectric conversion elements 3 such that the packing factor falls within the range of more than 0 to 0.3 or less, the temperature difference between the element front surfaces 3a and the element rear surfaces 3b can be secured, so that the power to be generated can be increased. Furthermore, by arranging the thermoelectric conversion elements 3 such that the packing factor falls within the range of 0.006 or more to 0.03 or less, the power to be obtained is further increased.

Embodiment 5

Figure 22:
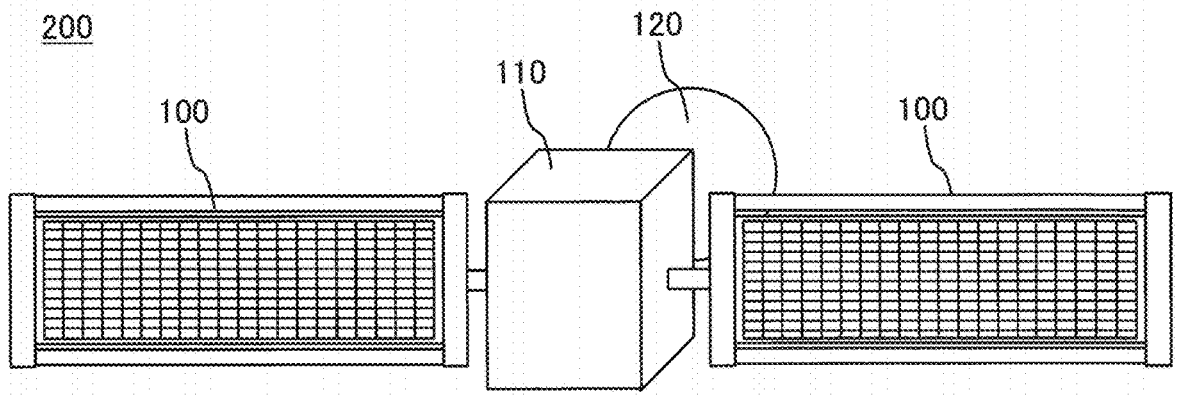
FIG. 22 is a perspective view illustrating a schematic configuration of a space structure provided with solar power generation paddles according to Embodiment 5 of the present invention.
Figure 23:
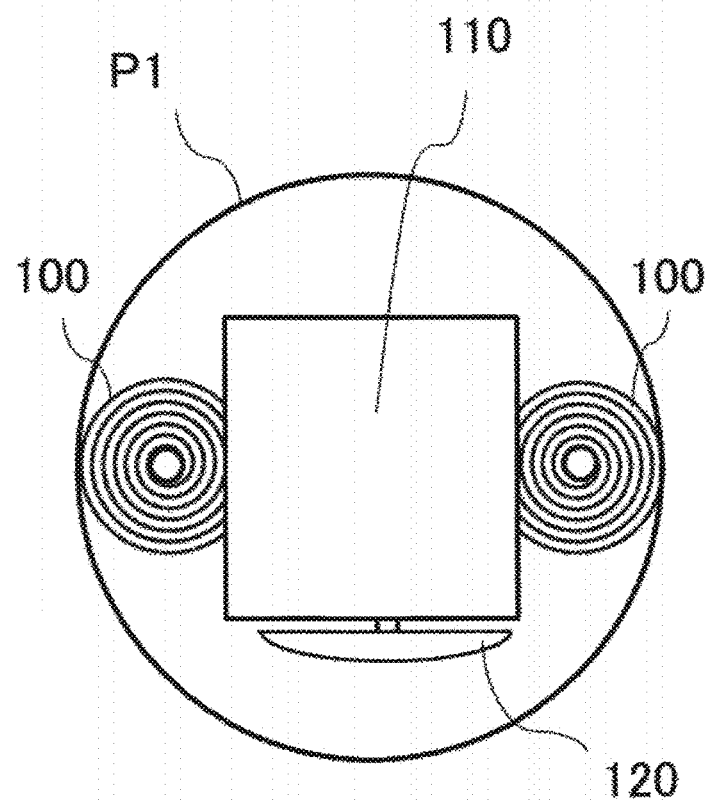
FIG. 23 is a plan view illustrating a schematic configuration of the space structure provided with the solar power generation paddles according to Embodiment 5 of the present invention.

A space structure according to Embodiment 5 to practice the present invention will be escribed with referring to FIGS. 22 to 24. In FIGS. 22 to 24, the same reference sign as in FIG. 1 denotes the same or equivalent portion. Below, a description on the same respect as that of Embodiment 1 will be omitted, and a difference from Embodiment 1 will mainly be described.

FIG. 22 is a schematic configuration diagram illustrating a space structure provided with solar power generation paddles according to Embodiment 5 of the present invention. As illustrated in FIG. 22, a space structure 200 is, for example, an artificial satellite, and is provided with solar power generation paddles 100, a structure body 110, and an antenna 120. The structure body 110 is, for example, a satellite structure. The solar power generation paddles 100 are connected to, for example, two sides of the structure body 110. The antenna 120 is attached to, for example, an upper surface or front surface of the structure body 110.

In the solar power generation paddle 100, a plurality of solar battery cells 2 are disposed on one surface of a blanket 1, and a plurality of thermoelectric conversion elements 3 are disposed on the other surface of the blanket 1. A plurality of heat dissipation members 4 are disposed on surfaces of the thermoelectric conversion elements 3 which are opposite to the surfaces near the blanket 1, along an extending direction. Power generated by the solar battery cells 2 and by the thermoelectric conversion elements 3 is extracted via wiring (not illustrated) and sent to the structure body 110. A first extension mast 5 and a second extension mast 6 are provided on two sides of the blanket 1 to store the blanket 1 into a roll and extend the blanket 1.

FIG. 23 is a schematic configuration diagram illustrating a space structure provided with the solar power generation paddles according to Embodiment 5 of the present invention. FIG. 23 illustrates an artificial satellite as it is stored in a fairing P1 which is a distal end portion of a rocket. As illustrated in FIG. 23, at the time of launching the rocket, the solar power generation paddle 100 is stored in the fairing P1 of the rocket, with each blanket 1 being taken up into a roll. After the space structure 200 is exposed to the space, the solar power generation paddle 100, together with the first extension mast 5 and the second extension mast 6, extends the blanket 1. After the blanket 1 is extended, the solar battery cells 2 receive sunlight and start power generation.

As described above, the space structure 200 according to the present embodiment is provided with the solar power generation paddles 100 in each of which the plurality of heat dissipation members 4 are disposed on the surfaces of the thermoelectric conversion elements 3 which are opposite to the surfaces near the blanket 1, along the extending direction P. Therefore, even when storing the solar power generation paddle 100 by taking up into a roll, dropping of and damage to the thermoelectric conversion elements 3 can be prevented. Because of the heat dissipation members 4, when the blanket 1 is extended in the space, a temperature difference between element front surfaces 3a and element rear surfaces 3b of the thermoelectric conversion elements 3 can be secured, so that the power to be generated can be increased. Furthermore, since the space structure 200 is provided with the solar power generation paddles 100 which can take up the blankets 1 into rolls using the first extension mast 5 and the second extension mast 6, at the time of launching, the space structure 200 can be stored in the fairing P1 of the rocket easily.

An example has been presented in which the space structure 200 is an artificial satellite. The space structure 200 may be another space structure. FIG. 24 is a schematic configuration diagram illustrating another example of the space structure provided with the solar power generation paddles according to Embodiment 5 of the present invention. As illustrated in FIG. 24, a space structure 200 is, for example, a space station. A structure body 110 of the space station is provided with, for example, a structure frame called a truss. At least one solar power generation paddle 100 is attached to the structure body 110. FIG. 24 illustrates an example in which four solar power generation paddles 100 are attached. One solar power generation paddle 100, or four solar power generation paddles 100 or more may be attached.

In Embodiments 1 to 5, the heat dissipation members 4, the first extension mast 5, the second extension mast 6, the first support member 7, and the second support member 8 are made of carbon fiber reinforced plastic. Another reinforced fiber plastic such as glass fiber reinforced plastic may be used as far as it is composed of a combination of reinforced fibers and a resin.

In Embodiments 1 to 5, two extension masts, namely the first extension mast 5 and the second extension mast 6, are used. It suffices as far as at least one extension mast is used. For example, one extension mast may be arranged at the center of the blanket 1.

In Embodiments 1 to 4, the blanket 1 is taken up into a roll such that the solar battery cells 2 are located on the inner side in the radial direction and the thermoelectric conversion elements 3 are located on the outer side in the radial direction. Alternatively, the solar battery cells 2 may be located on the outer side in the radial direction, and the thermoelectric conversion elements 3 may be located on the inner side in the radial direction.

In the present invention, the plurality of constituent elements disclosed in Embodiments 1 to 5 may be combined as necessary within a range not departing from the gist of the present invention.

REFERENCE SIGNS LIST

1: blanket; 2: solar battery cell; 3: thermoelectric conversion element; 3a: element front surface; 3b: element rear surface; 4: heat dissipation member; 5: first extension mast; 6: second extension mast; 7: first support member; 8: second support member; 9: adhesive layer; 10a: adhesive layer; 10b: adhesive layer; 11: first extension mast prepreg laminate; 12: second extension mast prepreg laminate; 13: shaft member; 14: bagging film; 15: seal member; 16: heat-dissipation-member prepreg laminate; 17: frame member; 18: radiation heat insulating member; 19: high-heat conduction sheet; 20: gap; 21: region; 100: solar power generation paddle.

The invention claimed is:

1. A solar power generation paddle comprising:
   a blanket;
   an extension mast having a function of storing, by taking up, the blanket into a roll, and a function of extending the blanket;
   a plurality of solar battery cells disposed on one surface of the blanket;
   a plurality of thermoelectric converters disposed on the other surface of the blanket; and a plurality of heat dissipators disposed on surfaces of the thermoelectric converters which are opposite to surfaces near the blanket, along an extending direction of the extension mast, wherein the plurality of thermoelectric converters is configured to generate power utilizing temperature difference between high-temperature element front surfaces and low-temperature element rear surfaces of the plurality of thermoelectric converters, the plurality of heat dissipators is adhered to the low-temperature element rear surfaces of the plurality of thermoelectric converters through only an adhesive layer, and a width, along the extending direction of the extension mast, of the heat dissipator disposed near a takeup start point of the blanket is smaller than a width, along the extending direction of the extension mast, of the heat dissipator disposed near a takeup terminal point of the blanket.

2. The solar power generation paddle according to claim 1, wherein the plurality of heat dissipators are disposed in a direction perpendicular to the extending direction of the extension mast.

3. The solar power generation paddle according to claim 1, wherein a thermal expansion coefficient of a surface of the heat dissipator which is near the thermoelectric converter is larger than a thermal expansion coefficient of a surface of the heat dissipator which is opposite to the surface near the thermoelectric converter.

4. The solar power generation paddle according to claim 1, wherein on the blanket, one thermoelectric converter is disposed on each of a plurality of regions having equal areas.

5. The solar power generation paddle according to claim 1, wherein a ratio of a total of contact areas of the plurality of thermoelectric converters with the blanket to an area of the other surface of the blanket falls within a range of more than 0 to 0.3 or less.

6. The solar power generation paddle according to claim 1, wherein a radiation heat insulator is at a part of the other surface of the blanket where the thermoelectric converters are not arranged.

7. The solar power generation paddle according to claim 1, wherein a high-heat conduction sheet is on at least either the other surface of the blanket or surfaces of the heat dissipators which are opposite to the thermoelectric converters.

8. A space structure comprising:
the solar power generation paddle according to claim 1; and
a structure body to which the solar power generation paddle is attached.

9. The solar power generation paddle according to claim 1, wherein the heat dissipators are flat plate made of carbon fiber reinforced plastic.

10. A method of manufacturing a solar power generation paddle, the method comprising:
a step of forming an extension mast comprising laminating a plurality of prepregs, winding the prepregs around a shaft and covering the prepregs with a bagging film, pressurizing and heating the prepregs from outside the bagging film, and removing the shaft and the bagging film;
a step of disposing the extension mast on each of two sides of a blanket;
a step of disposing a plurality of solar battery cells on one surface of the blanket;
a step of disposing a plurality of thermoelectric converters on the other surface of the blanket; and
a step of disposing a plurality of heat dissipators on surfaces of the thermoelectric converters which are opposite to the blanket, along an extending direction of the extension mast,
wherein the plurality of thermoelectric converters is configured to generate power utilizing temperature difference between high-temperature element front surfaces and low-temperature element rear surfaces of the plurality of thermoelectric converters,
the plurality of heat dissipators is adhered to the low-temperature element rear surfaces of the plurality of thermoelectric converters through only an adhesive layer, and
a width, along the extending direction of the extension mast, of the heat dissipator disposed near a takeup start point of the blanket is smaller than a width, along the extending direction of the extension mast, of the heat dissipator disposed near a takeup terminal point of the blanket.

11. The method of manufacturing a solar power generation paddle according to claim 10, wherein the plurality of heat dissipators are disposed in a direction perpendicular to the extending direction of the extension mast.

12. The method of manufacturing a solar power generation paddle according to claim 10, wherein a thermal expansion coefficient of a surface of the heat dissipator which is near the thermoelectric converter is larger than a thermal expansion coefficient of a surface of the heat dissipator which is opposite to the surface near the thermoelectric converter.

13. The method of manufacturing a solar power generation paddle according to claim 10, wherein on the blanket, one thermoelectric converter is disposed on each of a plurality of regions having equal areas.

14. The method of manufacturing a solar power generation paddle according to claim 10, wherein a ratio of a total of contact areas of the plurality of thermoelectric converters with the blanket to an area of the other surface of the blanket falls within a range of more than 0 to 0.3 or less.

15. The method of manufacturing a solar power generation paddle according to claim 10, wherein a radiation heat insulator is at a part of the other surface of the blanket where the thermoelectric converters are not arranged.

16. The method of manufacturing a solar power generation paddle according to claim 10, wherein a high-heat conduction sheet is formed on at least either the other surface of the blanket or surfaces of the heat dissipators which are opposite to the thermoelectric converters.

* * * * *